(12) United States Patent
Higashi et al.

(10) Patent No.: US 7,839,699 B2
(45) Date of Patent: Nov. 23, 2010

(54) SEMICONDUCTOR MEMORY DEVICE

(75) Inventors: Tomoki Higashi, Yokohama (JP);
Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 12/050,386

(22) Filed: Mar. 18, 2008

(65) Prior Publication Data
US 2008/0232181 A1 Sep. 25, 2008

(30) Foreign Application Priority Data
Mar. 22, 2007 (JP) .............................. 2007-074783

(51) Int. Cl.
*G11C 7/00* (2006.01)
*G11C 7/02* (2006.01)
*G11C 5/14* (2006.01)

(52) U.S. Cl. .................. 365/189.09; 365/201; 365/205; 365/207; 365/208; 365/226

(58) Field of Classification Search ............ 365/189.09, 365/201, 205, 207, 208, 226
See application file for complete search history.

(56) References Cited

U.S. PATENT DOCUMENTS

| 5,179,537 | A |   | 1/1993  | Matsumoto |         |
|-----------|---|---|---------|-----------|---------|
| 5,436,911 | A | * | 7/1995  | Mori      | 365/201 |
| 5,650,961 | A |   | 7/1997  | Himeno et al. | |
| 5,761,125 | A |   | 6/1998  | Himeno    |         |
| 5,926,422 | A | * | 7/1999  | Haukness  | 365/201 |
| 6,191,987 | B1 | * | 2/2001 | Ogawa     | 365/201 |
| 6,489,819 | B1 | * | 12/2002 | Kono et al. | 365/201 |
| 6,574,159 | B2 | * | 6/2003 | Ohbayashi et al. | 365/201 |
| 6,584,007 | B2 | * | 6/2003 | McClure   | 365/201 |
| 6,584,020 | B2 | * | 6/2003 | Yamauchi et al. | 365/201 |
| 6,940,767 | B2 | * | 9/2005 | Ooishi et al. | 365/201 |

FOREIGN PATENT DOCUMENTS

| JP | 8-55488    | 2/1996 |
|----|------------|--------|
| JP | 2000-173300 | 6/2000 |

* cited by examiner

*Primary Examiner*—Trong Phan
(74) *Attorney, Agent, or Firm*—Oblon, Spivak, McClelland, Maier & Neustadt, L.L.P.

(57) ABSTRACT

This disclosure concerns a semiconductor memory device comprising: a memory cell array having memory cells arrayed two-dimensionally; word lines connected to the memory cells of rows of the memory cell array; bit lines connected to the memory cells of columns of the memory cell array; sense amplifiers connected to the bit lines, and detecting data stored in the memory cells; a test pad passing a predetermined reference current from a power source, and transmitting a reference voltage based on the reference current; and test circuits connected between the power source and the test pad and intervening between the power source and the bit lines, the test circuits passing test currents according to the reference voltage via the bit lines.

16 Claims, 15 Drawing Sheets

SEMICONDUCTOR MEMORY DEVICE

CROSS-REFERENCE TO RELATED APPLICATIONS

This application is based upon and claims the benefit of priority from the prior Japanese Patent Applications No. 2007-74783, filed on Mar. 22, 2007, the entire contents of which are incorporated herein by reference.

BACKGROUND OF THE INVENTION

1. Field of the Invention

The present invention relates to a semiconductor memory device. For example, the invention relates to a semiconductor memory device which has FBCs (Floating Body Cells).

2. Related Art

In recent years, there is an FBC memory device as a semiconductor memory device expected as a memory replacing a 1T(Transistor)-1C (Capacitor) type DRAM. The FBC memory device has an FET (Field Effect Transistor) having a floating body (hereinafter, also "body") formed on an SOI (Silicon On Insulator) substrate, and stores data "1" or data "0" depending on the number of majority carriers accumulated in this body.

As test items of the FBC memory, there are a static characteristic of a memory cell, a writing characteristic, a data retention characteristic, and a threshold voltage distribution. A test result of a memory cell formed in various process conditions is used to determine an optimum process condition and to analyze a defect cause. Many memory cells within a memory cell array need to be tested. To test the characteristics of these many memory cells, wirings for directly accessing the memory cells from an external pad via a DQ line are provided.

In the case of measuring a threshold voltage of a memory cell, for example, a change of a current flowing from the external pad to the memory cell is measured by controlling a gate voltage (word line voltage) of the memory cell. That is, a testing device directly applies a voltage to the memory cell through an external pad, without using a sense amplifier or a DQ buffer, thereby directly measuring the flowing current. The testing device changes the word line voltage from a low voltage to a high voltage. Further, the testing device uses as a threshold voltage the word line voltage when a predetermined current flows from the external pad to the memory cell. By repeatedly performing this to all memory cells, a distribution of the threshold voltage can be obtained.

However, usually because there is a variation in the threshold voltage of a memory cell, a current flowing from the external pad to the memory cell at a certain word line voltage is different for each bit. When the word line voltage is changed, a current flowing from the external pad to the memory cell also changes. Therefore, it has been difficult to simultaneously test all memory cells connected to a certain word line. Consequently, conventionally, the test needs to be executed to each bit. Accordingly, a long measuring time is necessary to test all the memory cells. Further, when the number of memory cells within the memory cell array increases, the test time becomes longer.

SUMMARY OF THE INVENTION

A semiconductor memory device according to an embodiment of the present invention comprises a memory cell array having memory cells arrayed two-dimensionally; word lines connected to the memory cells of rows of the memory cell array; bit lines connected to the memory cells of columns of the memory cell array; sense amplifiers connected to the bit lines, and detecting data stored in the memory cells; a test pad passing a predetermined reference current from a power source, and transmitting a reference voltage based on the reference current; and test circuits connected between the power source and the test pad and intervening between the power source and the bit lines, the test circuits passing test currents according to the reference voltage via the bit lines.

DETAILED DESCRIPTION OF THE INVENTION

Embodiments of the present invention will be explained below in detail with reference to the accompanying drawings. Note that the invention is not limited thereto.

First Embodiment

Figure 1:
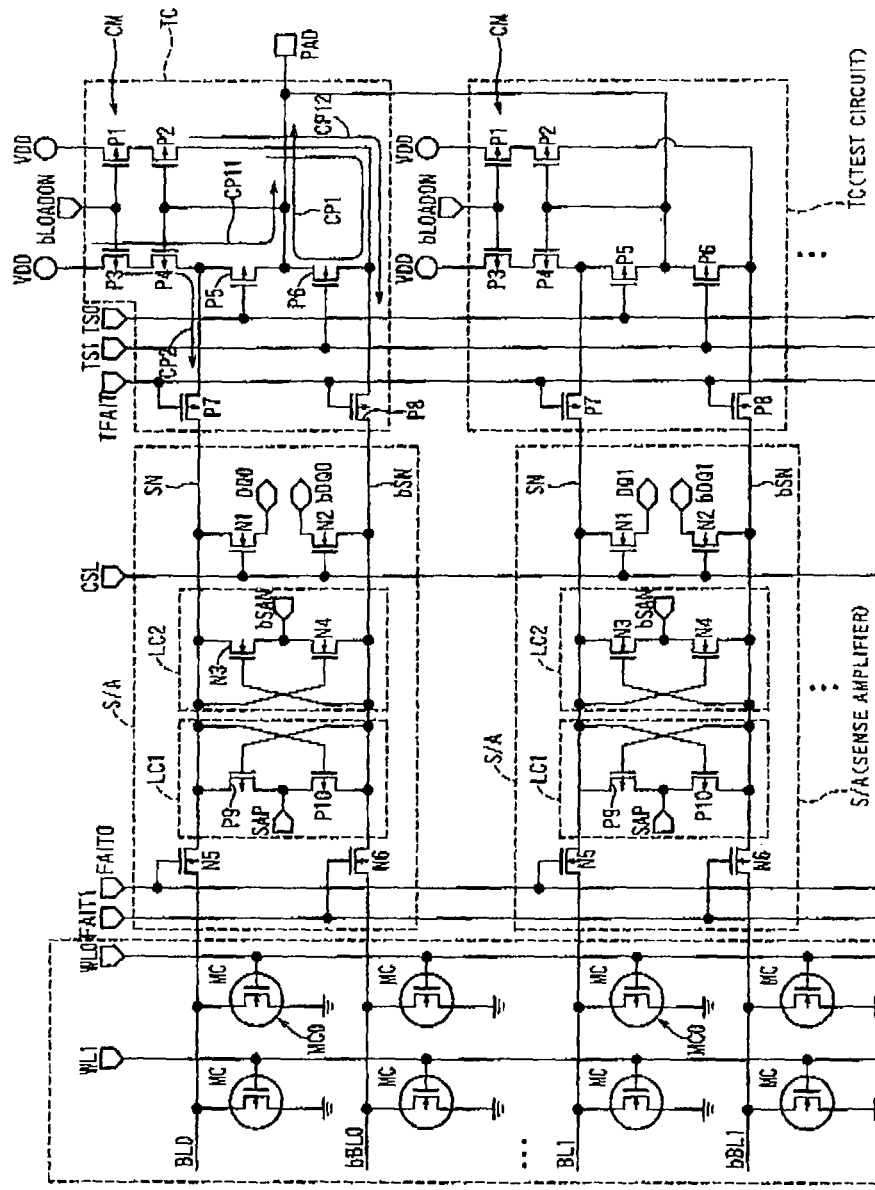
FIG. 1 is a circuit diagram of an FBC memory according to a first embodiment of the present invention.

FIG. 1 is a circuit diagram of an FBC memory according to a first embodiment of the present invention. The FBC memory includes a memory cell array MCA, sense amplifiers S/As, and test circuits TCs.

The memory cell array MCA includes plural memory cells arrayed two-dimensionally in a matrix shape. Word lines WLi (i is an integer) (hereinafter, also WLs) extend in a row direction, and are connected to gates of memory cells MCs of the rows of the memory cell array MCA. The integer i is 0 to 255, for example, and only WL0 and WL1 are shown in FIG. 1 for simplicity. Bit lines BLj and bBLj (j is an integer) (hereinafter, also BL, bBL) extend in a column direction, and are connected to drains or sources of the memory cells MCs of the columns of the memory cell array MCA. The integer j is 0 to 511, for example, and only BL0, bBL0, BL1, and bBL1 are shown in FIG. 1 for simplicity. The bit line bBL transmits a theoretically inverted signal to a signal on BL. BL and bBL form a bit line pair. The word line WL and the bit line pair BL, bBL are orthogonal with each other, and a memory cell MC is provided at each intersection. These cells are called "crosspoint type cells". The row direction and the column direction can be replaced with each other.

Each sense amplifier S/A is provided corresponding to each bit line pair BL, bBL. As explained above, the present embodiment employs what is called a two-cell/bit system (also called a twin cell). This system stores data of opposite logics in two memories MCs forming a pair, thereby storing one-bit data. The sense amplifier S/A uses one of the data of the opposite logic as a basis, and detects the other data. However, the present invention can be also applied to a device having a one-cell/bit system or an open-bit line structure, as well as a device having the two-cell/bit system.

The sense amplifier S/A includes a pair of sense nodes SN, bSN. The sense node pair SN, bSN is connected to a corresponding bit line pair BL, bBL via transfer gates N5, N6. The transfer gates N5 and N6 are on/off controlled by signals FAIT0 and FAIT1, respectively. To test the memory cell MC connected to the bit line BL, the transfer gate N5 is set to the on state, and the sense node SN is connected to the bit line BL. In this case, the transfer gate N6 is in the off state. To test the memory cell MC connected to the bit line bBL, the transfer gate N6 is set to the on state, and the sense node bSN is connected to the bit line bBL. In this case, the transfer gate N5 is in the off state.

The sense amplifier S/A includes cross-couple type dynamic latch circuits (hereinafter, also "latch circuits") LC1 and LC2. The latch circuit LC1 includes two p-type transistors P9 and P10 connected in series between the sense nodes SN and bSN. A gate of the transistor P9 is connected to the sense node bSN, and a gate of the transistor P10 is connected to the sense node SN. That is, the gates of the transistors P9 and P10 are cross-connected to the sense nodes SN and bSN. The latch circuit LC2 includes two n-type transistors N3 and N4 connected in series between the sense nodes SN and bSN. A gate of the transistor N3 is connected to the sense node bSN, and a gate of the transistor N4 is connected to the sense node SN. That is, the gates of the transistors N3 and N4 are also cross-connected to the sense nodes SN and bSN. The latch circuits LC1 and LC2 are driven by activating signals SAP and bSAN.

The activation means to turn on or drive an element or a circuit, and inactivation means to turn off or stop an element or a circuit. Therefore, it should be noted that a HIGH (high-potential level) signal can be an activation signal, and a LOW (low-potential level) signal can be an activation signal. For example, an NMOS transistor is activated by setting the gate to HIGH. On the other hand, a PMOS transistor is activated by setting the gate to LOW. The signal SAP activates the latch circuit LC1 when the signal SAP is at the high-potential level. The signal bSAN activates the latch circuit LC2 when the signal bSAN is at the low-potential level.

The n-type transistor N1 is connected between the sense node SN and the DQ line DQ0, and the n-type transistor N2 is connected between the sense node bSN and the DQ line bDQ0. The transistors N1, N2 are controlled by a column selection line CSL. The DQ line pairs DQ0, bDQ0, and DQ1, bDQ1 are connected to a DQ buffer (not shown). The DQ buffer is connected to an I/O pad. At the time of reading data to an external of the memory device, the DQ buffer temporarily stores data from the memory cell MC to output the data to the outside. At the time of writing data from the external of the memory device, the DQ buffer temporarily stores data from the outside to transmit the data to the sense amplifier S/A. Accordingly, the column selection line CSL is activated at the time of reading data to the outside of the memory device or at time of writing data from the outside of the memory device, thereby making it possible to connect the sense nodes SN and bSN to the DQ buffer.

In the operation of data reading to the outside of the memory device (normal reading operation), the sense amplifier S/A detects data stored in the memory cell MC, and the latch circuits LC1, LC2 latch this data to the sense node pair SN, bSN. The data latched into the sense nodes SN, bSN is temporarily stored in the DQ buffer via the DQ line, and is output from the I/O pad to the outside. In the operation of data writing from the outside of the memory device (normal writing operation), the DQ buffer temporarily stores data input from the I/O pad. This data is transmitted to the sense amplifier S/A via the DQ line. The latch circuits LC1, LC2 latch this data to the sense node pair SN, bSN. The data latched into the sense nodes SN, bSN is written into the memory cell MC via the bit line pair BL, bBL.

The test circuit includes a current mirror circuit CM including p-type transistors P1 to P4, selection transistors P5, P6, and transfer gates P7, P8. The transistors P1 and P3 are switching elements that are on/off controlled by a signal bLOADON. The transistors P1 and P3 become in the on state when a current is passed from the current mirror circuit CM at the test time. The on resistance of the transistors P1 and P3 is negligibly smaller than the on resistance of the transistors P2 and P4.

The transistor P2 as a first transistor and the transistor P4 as a second transistor are present between power sources VDDs via the transistors P1 and P3 and a test pad PAD, or are present between the power sources VDDs via the transistors P1 and P3 and the sense node SN or bSN. A connection relationship between the transistors P2 and P4 changes depending on which one of memory cells connected to the bit lines BL and bBL is to be tested. The transistors P2 and P4 are structured to have a predetermined mirror ratio. The transistor P4 uses a current flowing through the transistor P2 as a reference, and passes a current corresponding to this reference current. Alternatively, the transistor P2 uses a current flowing through the transistor P4 as a reference, and passes a current corresponding to this reference current.

The selection transistor P5 as a fourth transistor is connected between the transistor P4 and the test pad PAD, and is controlled by a test signal TS0. The selection transistor P6 as a third transistor is connected between the transistor P2 and the test pad PAD, and is controlled by a test signal TS1. A node between the selection transistor P5 and the transistor P4 is connected to the sense node SN via the transfer gate P7. A node between the selection transistor P6 and the transistor P2 is connected to the sense node bSN via the transfer gate P8.

When a node between the sense node SN and the transistor P4 is called a first node and also when a node between the sense node bSN and the transistor P2 is called a second node, the selection transistors P5 and P6 are connected in series between the first node and the second node. A third node between the selection transistors P5 and P6 is connected to the test pad PAD.

The selection transistor P5 is turned on at the time of testing the memory cell MC connected to the bit line bBL, thereby connecting a source or a drain of the selection transistor P4 and the sense node SN to the test pad PAD. The selection transistor P6 is turned on at the time of testing the memory cell MC connected to the bit line BL, thereby connecting a source or a drain of the selection transistor P2 and the sense node bSN to the test pad PAD.

The transfer gate P7 including a p-type transistor is connected between the current mirror circuit CM and the sense node SN, and the transfer gate P8 including a p-type transistor is connected between the current mirror circuit CM and the sense node bSN. The transfer gates P7 and P8 are controlled by a signal TFAIT.

A first test for testing the memory cells MCs connected to the bit lines BLj and a second test for testing the memory cells MCs connected to the bit lines bBLj are explained next. It is assumed that the transistors P1, P3, P7, and P8 are all in the on state during the execution of the first and the second tests.

In the first test, the selection transistor P5 becomes in the off state, and the selection transistor P6 becomes in the on state. In this case, one of the drain and the source of the transistor P2 is connected to the power source VDD via the transistor P1. The other of the drain and the source of the transistor P2 is connected to the test pad PAD via the transistor P6. Accordingly, the transistor P2 makes a first current path indicated by an arrowhead CP1 conductive, and passes the current (reference current) from the power source VDD to the test pad PAD via the transistor P3. One of the drain and the source of the transistor P4 is connected to the power source VDD. The other of the drain and the source of the transistor P4 is connected to the sense node SN via the transfer gate P7. Accordingly, the transistor P4 makes a second current path indicated by an arrowhead CP2 conductive, and passes the test current to the memory cell concerned.

In the second test, the selection transistor P5 becomes in the on state, and the selection transistor P6 becomes in the off state. In this case, one of the drain and the source of the transistor P2 is connected to the power source VDD via the transistor P1. The other of the drain and the source of the transistor P2 is connected to the sense node bSN via the transfer gate P8. Accordingly, the transistor P2 makes a second current path indicated by an arrowhead CP12 conductive, and passes the test current to the memory cell concerned. One of the drain and the source of the transistor P4 is connected to the power source VDD via the transistor P3. The other of the drain and the source of the transistor P4 is connected to the test pad PAD via the transistor gate P5. Accordingly, the transistor P4 makes a first current path indicated by an arrowhead CP11 conductive, and passes the current (reference current) from the power source VDD to the test pad PAD. As explained above, the roles of the transistors P2 and P4 are replaced with each other between the first test and the second test.

As explained above, the current mirror circuit CM includes the first current path CP1 or CP11 and the second current path CP2 or CP12. In the first test for testing the memory cell MC connected to the bit line BL, the first and the second current paths become the paths indicated by the arrowheads CP1 and CP2 in FIG. 1. On the other hand, in the second test for testing the memory cell MC connected to the bit line bBL, the first and the second current paths become the paths indicated by the arrowheads CP11 and CP12 in FIG. 1.

The test pad PAD is connected to the current mirror circuit CM within the test circuit TC. The test pad PAD is commonly used for plural test circuits TCs provided in plural columns within the memory cell array MCA. For example, one test pad PAD is provided within the memory cell array MCA. The test pad PAD is connected to the first path CP1 or CP11 for passing the reference current. The reference current is a constant current becoming the reference at the time of detecting data of the memory cell MC, and does not change. The reference current can be equal in the test circuit TC of each column. That is, the test pad PAD can supply a constant current, and does not need to differentiate the current supplied to each test circuit TC. Therefore, the test pad PAD can be made common to the plural test circuits TCs.

Figure 2:
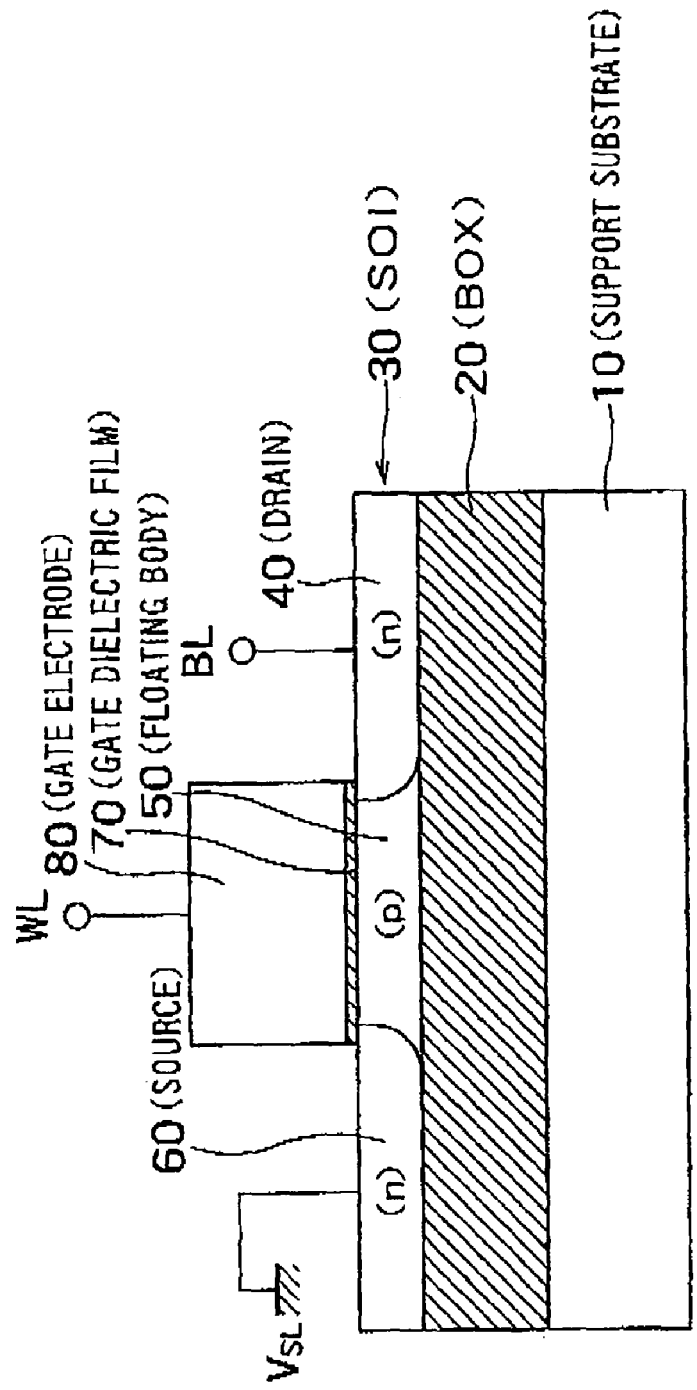
FIG. 2 is a cross-sectional view showing a structure of the memory cell MC.

FIG. 2 is a cross-sectional view showing a structure of the memory cell MC. The memory cell MC is provided on an SOI substrate including a supporting substrate 10, a BOX layer 20, and an SOI layer 30. A (n) source 60 and a drain 40 are provided within the SOI layer 30, A (p) floating body 50 is formed in the SOI layer 30 between the source 60 and the drain 40. The body 50 is a semiconductor having conductivity opposite to that of the source 60 and the drain 40. In the present embodiment, the memory cell MC is an N-type FET. A part or the whole of the body 50 is surrounded by the source 60, the drain 40, the BOX layer 20, a gate dielectric film 70, a gate electrode 80, and an STI (Shallow Trench Isolation) (not shown), so that the body 50 is in an electrically floating state. The FBC memory can store logic data (binary data) based on the number of majority carriers within the body 50.

One of methods for writing data into the memory cell MC is explained below. To write data "1" into the memory cell MC, the memory cell MC is operated in a saturated state. For example, the word line WL is biased at 1.5 V, and the bit line BL is biased at 1.5 V. The source is VSL (for example, ground GND (0V)). Accordingly, impact ionization occurs near the drain, and a large amount of electron-hole pairs occur. Electrons generated by impact ionization flow to the drain, and holes are stored in the body having low potential. When the current flowing at the time of the occurrence of the holes by impact ionization is balanced with the forward current in a pn junction between body sources, the body voltage reaches an equilibrium state. This body voltage is about 0.7 V.

At the time of writing the data "0", the bit line BL is decreased to a negative voltage. For example, the potential of the bit line BL is dropped to −1.5 V. By this operation, the pn junction between the body 50 and the drain 40 is greatly biased to a forward direction. The holes accumulated in the body 50 are discharged to the drain 40, and the data "0" is stored in the memory cell MC.

One of methods for reading data from the memory cell MC is explained below. In the data reading operation, the word line WL is activated simultaneously with the data writing. However, the bit line BL is set lower than that at the time of writing data "1". For example, the word line WL is set to 1.5 V, and the bit line BL is set to 0.2 V. The memory cell MC is operated in a linear region. The memory cell MC for storing the data "0" is different from the memory cell MC for storing the data "1" in the threshold voltages of the memory cells MCs due to the difference in the numbers of holes accumulated in the body 50. By detecting a difference between the threshold voltages, the data "1" and the data "0" are discriminated. A reason why the bit line BL is set to the low voltage at the reading time is that when the memory cell MC is biased to a saturated state by increasing the voltage of the bit line BL, there is a risk that the data "0" is changed to the data "1" by the impact ionization at the time of reading the data "0".

Figure 3:
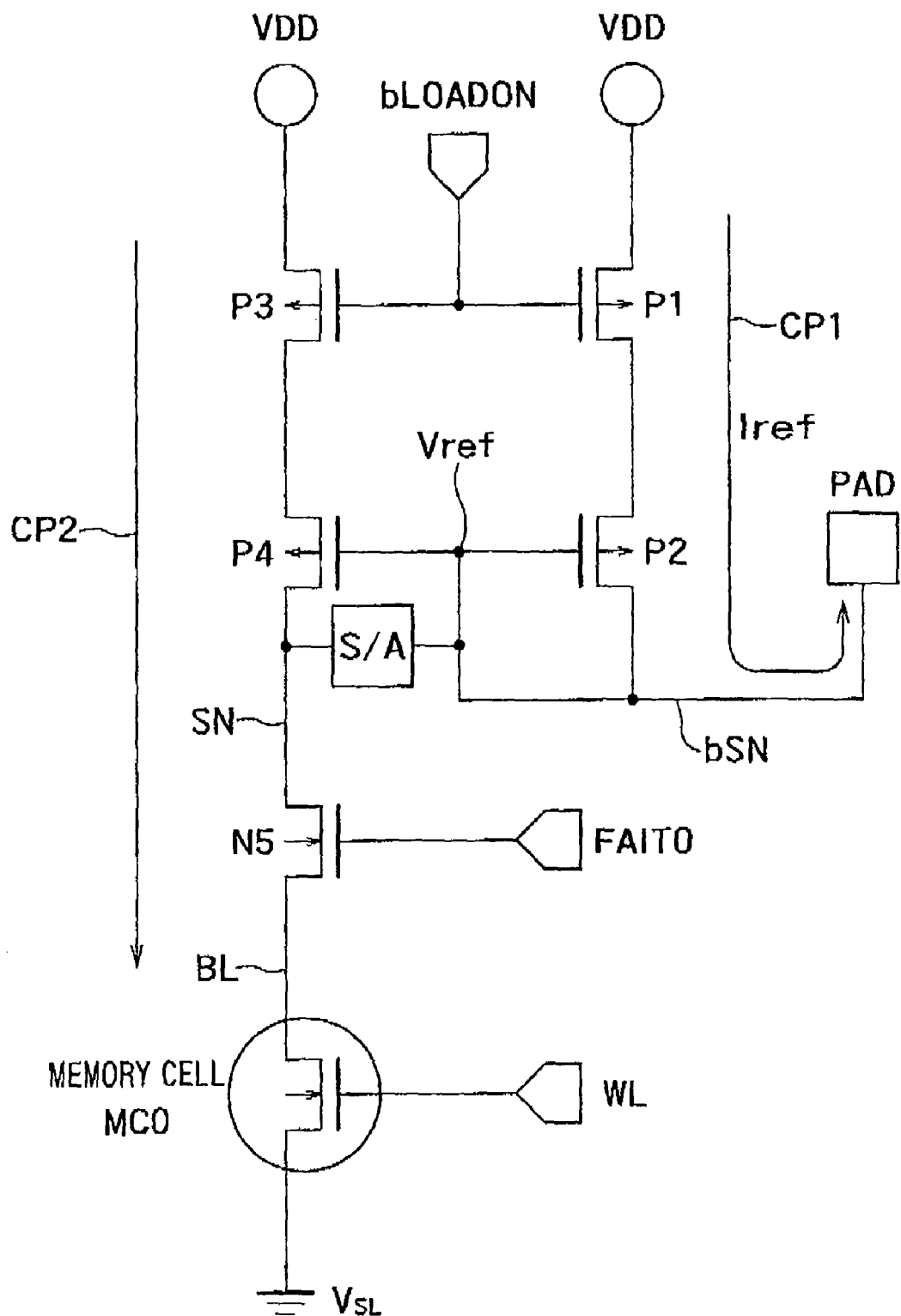
FIG. 3 is an equivalent circuit diagram of an FBC memory in the first test.
Figure 4A:
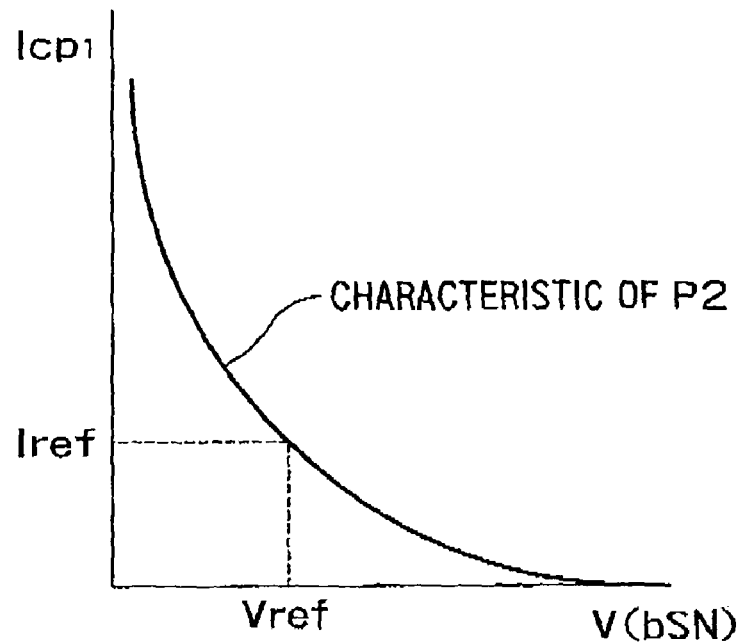
FIG. 4A is a graph showing a current Icp1-voltage V(bSN) characteristic of the first current path CP1.
Figure 4B:
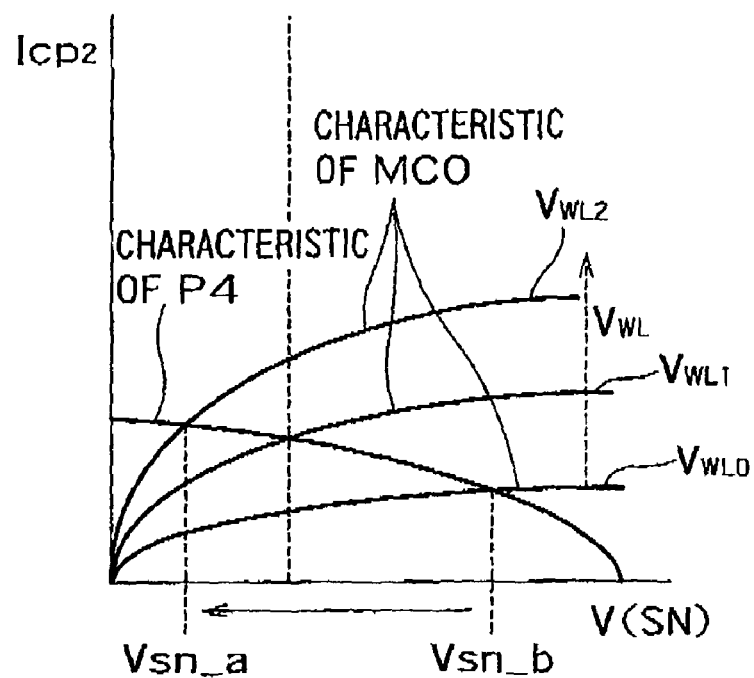
FIG. 4B is a graph showing a current Icp2-voltage V(SN) characteristic of the second current path CP2.

FIG. 3 is an equivalent circuit diagram of an FBC memory in the first test. S/A, N5 and FAITO in FIG. 3 indicate respectively a sense amplifier S/A, a transfer gate N5 and a signal FAITO as shown in FIG.1. FIG. 4A is a graph showing a current Icp1-voltage V(bSN) characteristic of the first current path CP1, and FIG. 4B is a graph showing a current Icp2-voltage V(SN) characteristic of the second current path CP2. A principle of detecting a threshold voltage of the memory cell MC0 is explained with reference to FIG. 3, FIG. 4A, and FIG. 4B. A vertical axis Icp1 represents a current flowing through the first current path CP1, and V(bSN) represents a potential of the sense node bSN. A vertical axis Icp2 represents a current flowing through the second current path CP2, and V(SN) represents a potential of the sense node SN.

The transistor P2 is diode-connected in the first current path CP1. Therefore, when the potential of the test pad PAD is increased and V(bSN) is increased as shown in FIG. 4A, the current Icp1 decreases. On the other hand, when the potential of the test pad PAD is decreased and V(bSN) is decreased, the current Icp1 increases. That is, Icp1 and V(bSN) are in an inversely proportional relationship. V(bSN), when Icp1 is set to the reference current Iref, is set as a reference voltage Vref. The reference current Iref can be optionally set to each of the memory cell MC ("1" cell) storing the data "1" and the memory cell MC ("0" cell) storing the data "0". The reference voltage Vref is commonly applied to the gates of the transistors P2 and P4. Accordingly, a test current based on the reference current Iref can pass through the second current path CP2.

The test current flowing through the second current path CP2 is determined based on the characteristic of the transistor P4 and the characteristic of the memory cell MC0 which is a target under the test. The transistor P4 is connected between the power source VDD and the sense node SN via the transistor P3. Therefore, the current flowing through the transistor P4 decreases when the potential of the sense node SN increases. On the contrary, the current flowing though the transistor P4 increases when the potential of the sense node SN decreases.

On the other hand, the target memory cell MC0 is connected between the sense node SN and the source potential VSL (ground potential). Therefore, the current flowing through the memory cell MC0 increases when the potential of the sense node SN increases. On the contrary, when the potential of the sense node SN decreases, the current flowing through the memory cell MC0 decreases. When the gate potential (word line voltage) of the memory cell MC0 is increased as shown by a broken-line arrowhead VWL in FIG. 4B, the current flowing to the memory cell MC0 naturally increases.

The intersection between the characteristic of the transistor P4 and the characteristic of the memory cell MC0 expresses a test current flowing through the second current path CP2 and a voltage applied to the sense node SN. When the word line voltage VWL is changed from a low state VWL0 to a high state VWL2, the potential V(SN) of the sense node SN changes from Vsn_b to Vsn_a. A word line voltage VWL1 at which the potential V(SN) becomes equal to the reference voltage Vref can be detected.

Figure 5:
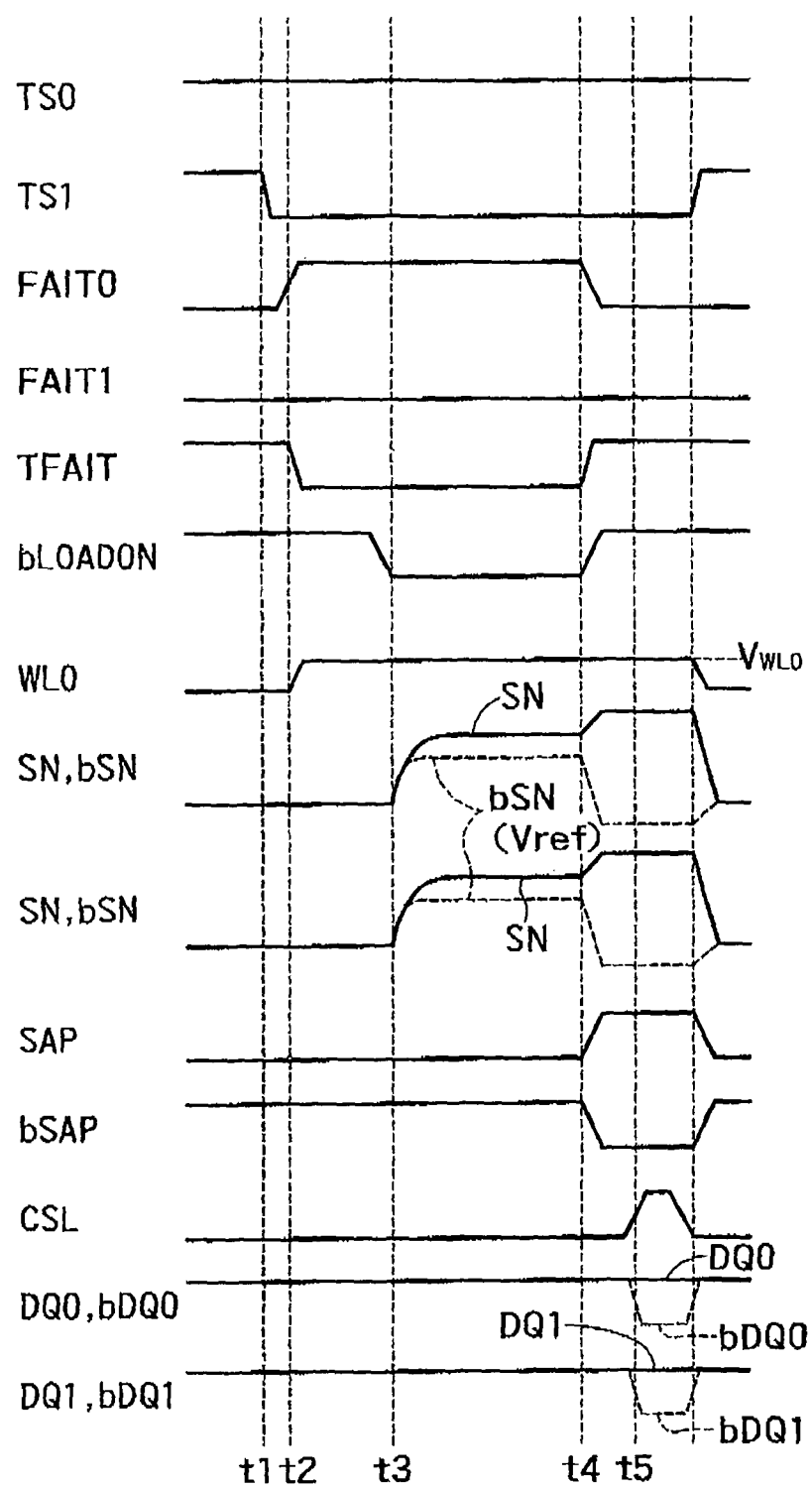
FIG. 5 and FIG. 6 are timing diagrams showing the operation of testing a threshold value of the FBC memory according to the present embodiment.
Figure 6:
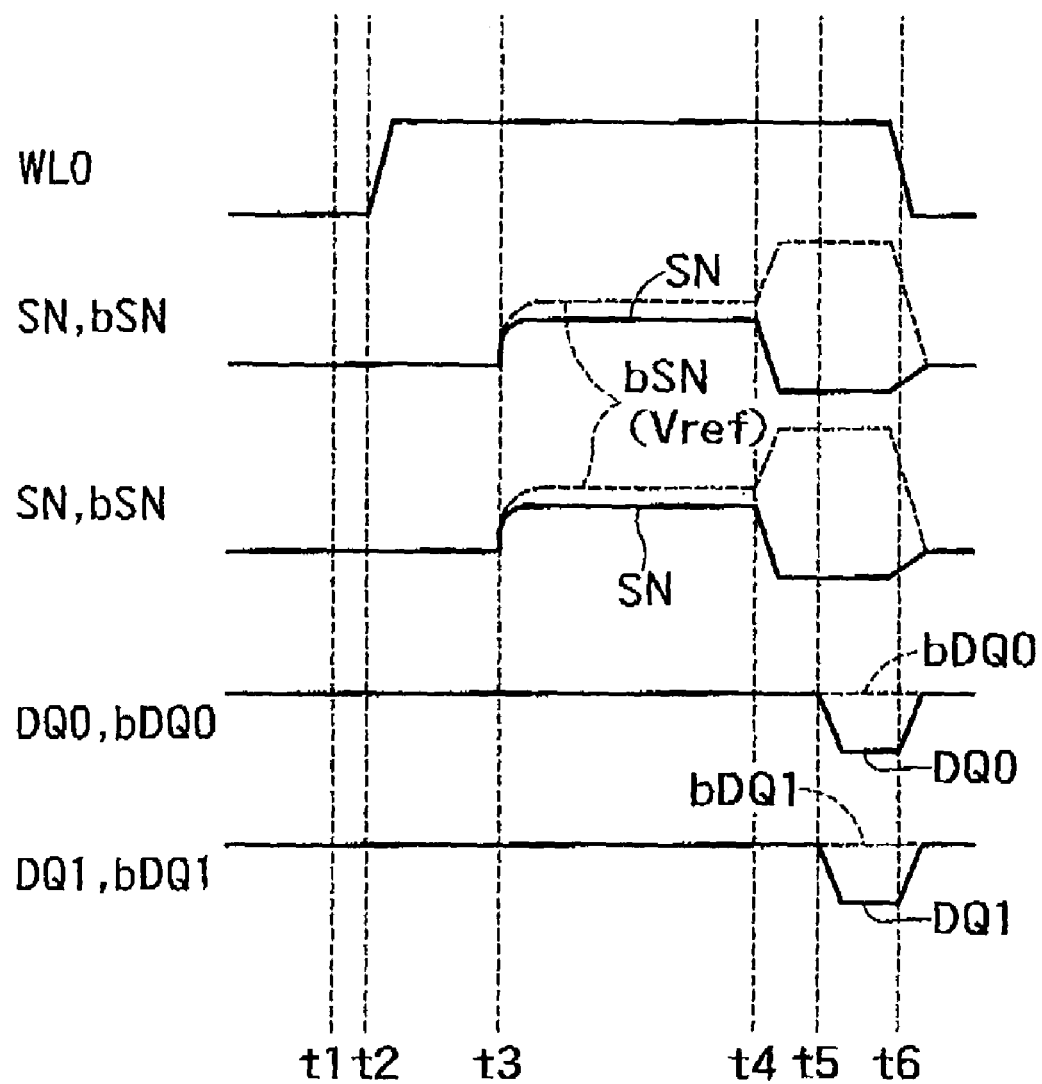

FIG. 5 and FIG. 6 are timing diagrams showing the operation of testing a threshold value of the FBC memory according to the present embodiment. FIG. 5 is a timing diagram when the word line voltage VWL is lower than the threshold voltage of the memory cell MC0, and FIG. 6 is a timing diagram when the word line voltage VWL is higher than the threshold voltage of the memory cell MC0.

Before time t1, the data "1" or "0" is written to the target memory cell MC concerned.

At time t1, the signal TS1 is activated, and the selection transistor P6 becomes in the on state. The selection transistor P5 maintains the off state. That is, in this case, the first test is executed to the memory cell of each column. In the second test, the states of the selection transistors P5 and P6 are reversed. Because the second test can be easily estimated, explanations thereof will be omitted.

At time t2, a signal TAIT0 is activated, and the transfer gate N5 becomes in the on state. Accordingly, the sense node SN is connected to the bit line BL0. The transfer gate N6 maintains the off state. In this case, the signal TFAIT is activated, and the transfer gates P7 and P8 become in the on state. Further, a voltage is applied to the selection word line WL0.

At the beginning, the word line voltage VWL is set to the voltage VWL0 lower than the threshold voltage of the target memory cell MC0.

At time t3, a signal bLOADON is activated, and the current mirror circuit CM is driven. Accordingly, the reference current Iref flows from the power source VDD to the test pad PAD via the first current path CP1. At the same time, a test current according to the reference current Iref and the word line voltage VWL flows from the power source VDD to the memory cell MC0 via the second current path CP2. In the present embodiment, the first and the second current paths are replaced with each other. That is, the transistor P2 can be present in the first current path in some case and can be present in the second current path in other case. This is similarly applied to the transistor P4. Therefore, the mirror ratio of the transistor P2 to the transistor P4 needs to be one. Accordingly, a threshold current defining the threshold voltage becomes the reference current Iref. When Vref is equal to the drain voltage of the transistor P4 (or P2), the mirror ratio becomes the ratio of the test current flowing through the second current path to the reference current flowing through the first current path, that is, the ratio of the test current to the reference current (test current/reference current).

Because the word line voltage VWL is the voltage VWL0 lower than the threshold voltage of the target memory cell MC0, the potential of the sense node SN becomes higher than the reference voltage Vref of the sense node bSN.

At time t4, when a potential difference between the potentials of the sense nodes SN and bSN is sufficiently developed, both signals SAP and bSAN are activated. In this case, to prevent a through-current from SAP and bSAN to VSL, the signal FAIT0 is inactivated. To disconnect the sense amplifier S/A from the test circuit TC, the signal TFAIT is also inactivated. Accordingly, capacitances of the sense nodes SN and bSN become small, and the potential difference between the potentials of the sense nodes SN and bSN can be easily amplified.

By activating the signals SAP and bSAN, the latch circuits LC1 and LC2 are driven. Accordingly, the potential difference between the potentials of the sense nodes SN and bSN is amplified as shown in FIG. 5.

At time t5, the column selection line CSL is activated. Accordingly, the transfer gates N1 and N2 become in the on state, and the sense node pair SN, bSN is connected to the DQ lines DQ, bDQ. Accordingly, the data latched into the sense node pair SN, bSN can be output to the outside via the DQ buffer.

At time t6, the signals SAP, bSAN, and TS1 are inactivated. Accordingly, a series of test operation of the word line voltage VWL0 ends.

Next, the test operation at t1 to t6 is repeated while increasing in stages the word line voltage VWL from VWL0. Because the data of FBC volatiles, the same data is rewritten to the memory cell MC, each time when the test operation at t1 to t6 is completed. When the word line voltage VWL exceeds the threshold voltage of the memory cell MC0, the data latched into the sense node pair SN, bSN are logically inverted. Accordingly, the threshold voltage of the memory cell MC can be measured. For example, when the word line voltage VWL exceeds the threshold voltage, the data latched into the sense node pair SN, bSN are inverted as shown in FIG. 6. The word line voltage VWL at this time or the word line voltage VWL immediately before is set as the threshold voltage. When the increased-voltage difference of the word line voltage VWL is smaller, the threshold voltage of the memory cell MC can be measured accurately. FIG. 6 shows only signals of different operation among the signals shown in FIG. 5.

The threshold voltage of the memory cell MC is executed both when the memory cell MC is the "0" cell and the "1" cell. The second test is also executed in a similar manner to that of the first test. Accordingly, the threshold voltage of the memory cell MC connected to the bit line bBL is also measured.

In the present embodiment, a threshold voltage of the memory cell MC is measured via the current mirror circuit CM. Accordingly, the test pad PAD can be made common to the test circuits TCs of all columns. That is, the test can be executed simultaneously to all columns, without the need of individually executing the test to each column. As a result, memory cells can be tested at a high speed, thereby decreasing the test time.

Second Embodiment

Figure 7:
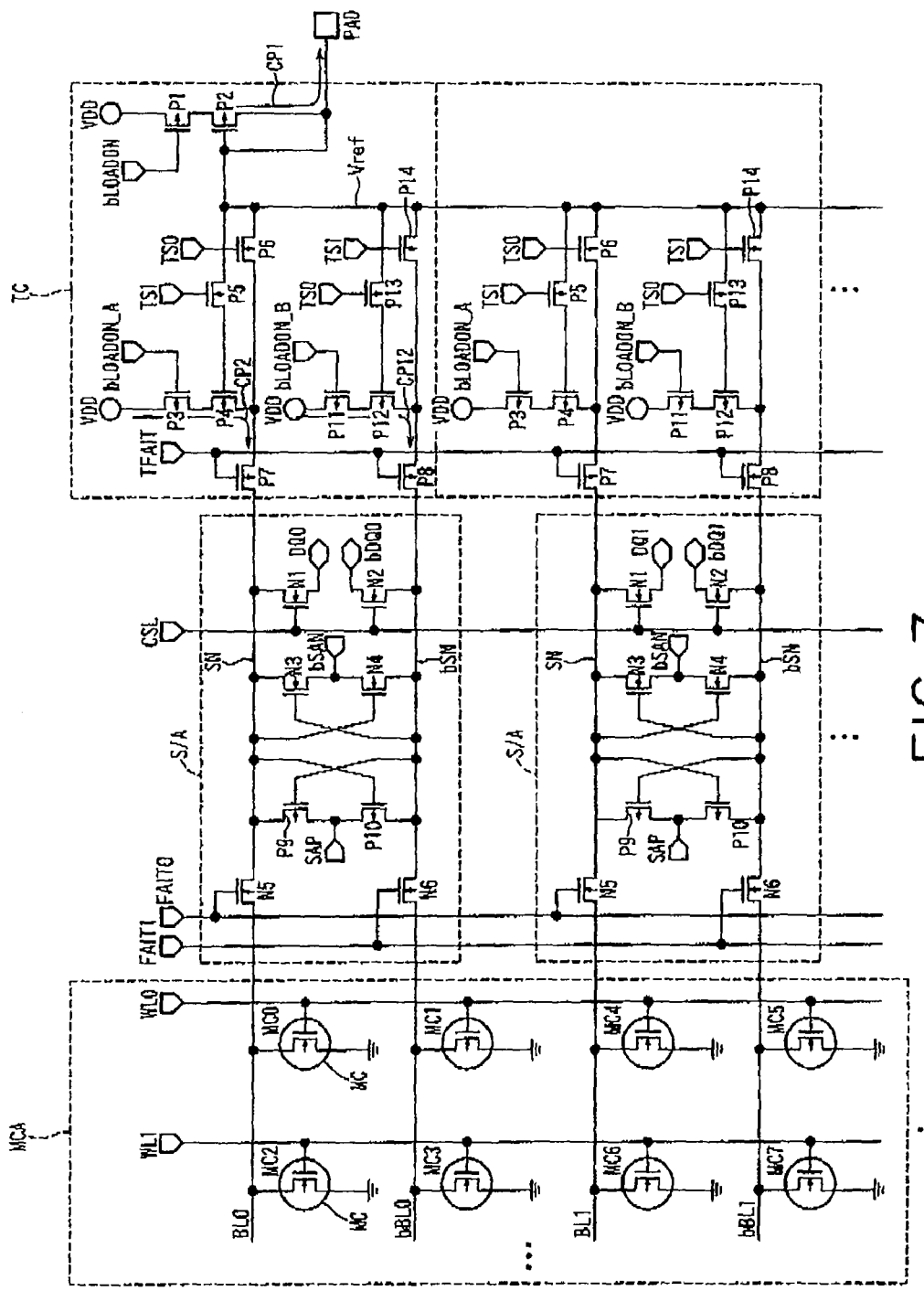
FIG. 7 is a circuit diagram of an FBC memory according to a second embodiment of the present invention.

FIG. 7 is a circuit diagram of an FBC memory according to a second embodiment of the present invention. In the second embodiment, not only the test pad PAD, but also the transistors P1 and P2 are also made common to the columns within the memory cell array MCA. In the second embodiment, the transistors P1 and P2 are always present in the first current path. That is, the first current path CP1 is made common to each column within the memory cell array MCA. Accordingly, a configuration of the test circuit TC is different from the configuration of the test circuit TC in the first embodiment. Other configurations in the second embodiment can be the same as those in the first embodiment.

Because the first current path CP1 is made common to all columns within the memory cell array MCA, the second current paths CP2 and CP12 need to be provided in the bit lines BLj and bBLj, respectively.

The test circuit includes the current mirror circuit CM including the p-type transistors P1 to P4, P11, and P12, the selection transistors P5, P6, P13, and P14, and the transfer gates P7, P8. The transistors P1, P3, and P11 are switching elements that are on/off controlled by signals bLOADON, bLOADON_A, and bLOADON_B, respectively. The transistors P1, P3, and P11 become in the on state when a current is passed from the current mirror circuit CM.

The transistor P2 as a first transistor is present between the power source VDD via the transistor P1 and the test pad PAD. The transistor P4 as a second transistor is present between the power source VDD via the transistor P3 and the sense node SN. Further, the transistor P12 is present between the power source VDD via the transistor P11 and the sense node SN. That is, the transistor P2 is provided in the first current path CP1. The transistors P4 and P12 are provided in the second current paths CP2 and CP12, respectively.

In the second embodiment, the current paths CP1 and CP2 of the first and the second current paths respectively are not replaced with each other. Therefore, current driving capacities of the transistors P2 and P4 can be asymmetrical. That is, the current mirror circuit CM can have a predetermined mirror ratio. For example, when Vref is equal to the drain voltage of the transistor P4, the mirror ratio is a proportion of the current flowing through the second current path CP2 to the reference current flowing through the first current path CP1.

Current driving capacities of the transistors P2 and P12 can be asymmetrical. For example, when a size (W (channel width)/L (channel length)) of each of the transistors P4 and P12 is set to 1/10 of the size of the transistor P2, a current of 1/10 of the reference current flows through the transistors P4 and P12 when the memory cell MC is in the on state. Accordingly, a noise component contained in the test current can be minimized to 1/10 of the noise component contained in the reference current. Further, because the reference current Iref becomes large, the rising speed of the potential of the sense node and the like becomes fast. This leads to the shortening of the test time. The size (W/L) of the transistor P4 is equal to that of the transistor P12. In the second embodiment, the first current path CP1 is common to the second current paths CP2 and CP12 of all columns. Therefore, the reference current Iref flowing through the first current path CP1 is constant regardless of the number of columns and the number of the second current paths CP2.

The selection transistor P5 as a fourth transistor is connected between the gate of the transistor P4 and the gate of the transistor P2. The selection transistor P6 is connected between the sense node SN and the gate of the transistor P2. The selection transistor P5 is turned on at the time of testing the memory cell MC connected to the bit line BL, thereby connecting the gate of the transistor P2 and the test pad PAD to the gate of the transistor P4. Accordingly, the selection transistor P5 transmits the reference voltage to the gate of the transistor P4. The selection transistor P6 as a third transistor is turned on at the time of testing the memory cell MC connected to the bit line bBL, thereby connecting the gate of the transistor P2 and the test pad PAD to the sense node SN. Accordingly, the selection transistor P6 transmits the reference potential to the sense node SN.

The selection transistor P13 is connected between the gate of the transistor P12 and the gate of the transistor P2. The selection transistor P14 is connected between the sense node bSN and the gate of the transistor P2. The selection transistor P13 is turned on at the time of testing the memory cell MC connected to the bit line BL, thereby connecting the gate of the transistor P2 and the test pad PAD to the gate of the transistor P12. Accordingly, the selection transistor P13 transmits the reference voltage to the gate of the transistor P12. The selection transistor P14 is turned on at the time of testing the memory cell MC connected to the bit line BL, thereby connecting the gate of the transistor P2 and the test pad PAD to the sense node bSN. Accordingly, the selection transistor P14 transmits the reference voltage to the sense node bSN.

The second transistor (P4), the third transistors (P6, P14, . . . ), and the fourth transistors (P5, P13, . . . ) are provided corresponding to each sense node (each bit line).

A first test for testing the memory cells MCs connected to the bit lines BLj and a second test for testing the memory cells MCs connected to the bit lines bBLj are explained next. It is assumed that the transistors P1, P3, P7, and P8 are all in the on state during the execution of the first and the second tests.

In the first test, the selection transistors P5 and P14 become in the on state, and the selection transistors P6 and P13 become in the off state. Accordingly, a test current flows through the second current path CP2. In this case, the transistor P2 makes the first current path CP1 conductive, and passes the current (reference current) from the power source VDD to the test pad PAD. The test voltage generated by the reference current is transmitted to the sense node bSN via the transistor P14.

In the second test, the selection transistors P5 and P14 become in the off state, and the selection transistors P6 and P13 become in the on state. Accordingly, a test current flows through the second current path CP12. In this case, the test voltage generated by the reference current is transmitted to the sense node SN via the transistor P6. In the first test and the second test according to the second embodiment, the transistor P2 always makes the first current path CP1 conductive. In the first test, CP2 becomes the second current path. In the second test, CP12 becomes the second current path.

Figure 8:
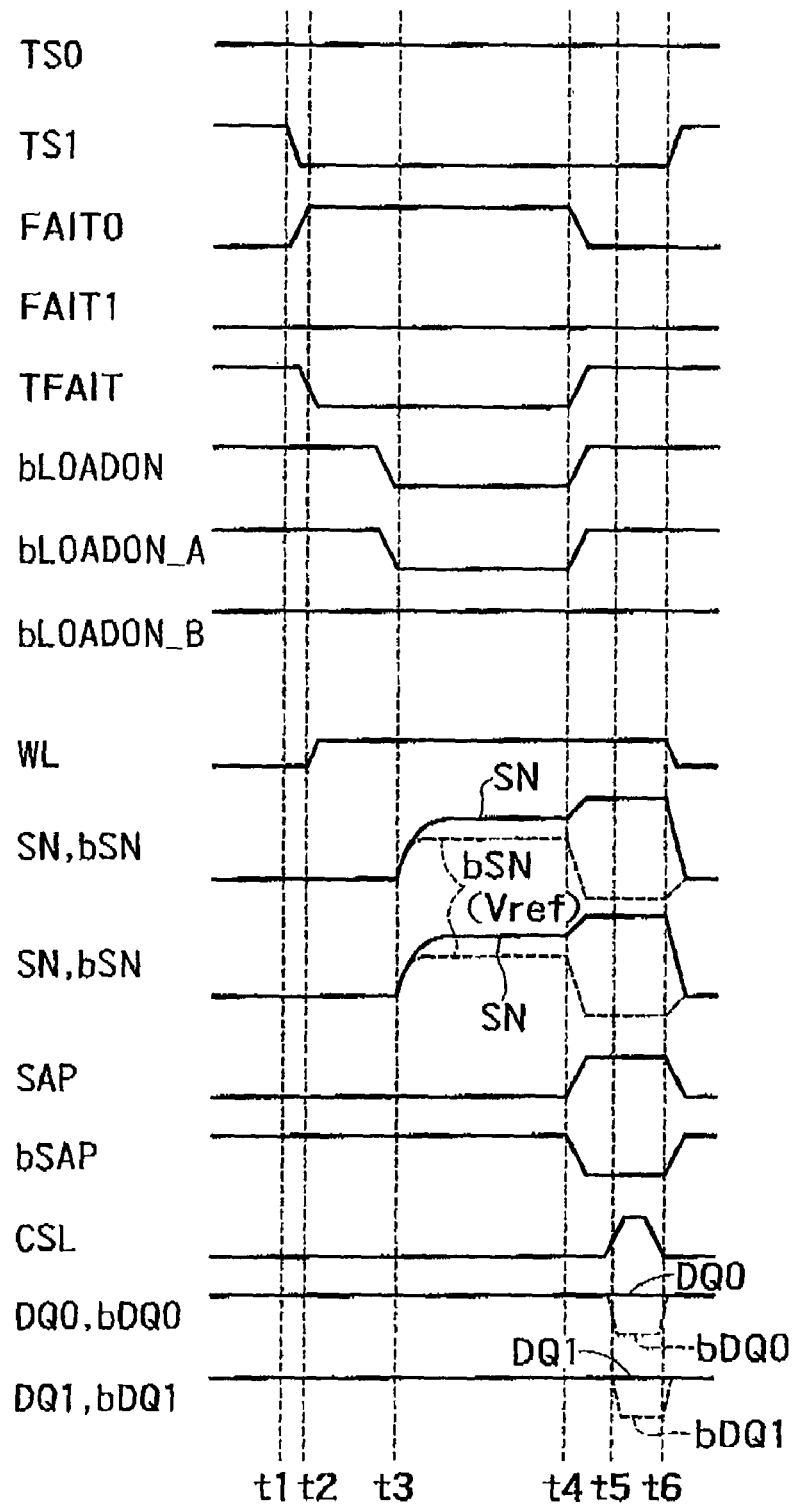
FIG. 8 and FIG. 9 are timing diagrams showing the operation of testing a threshold value of the FBC memory according to the second embodiment.
Figure 9:
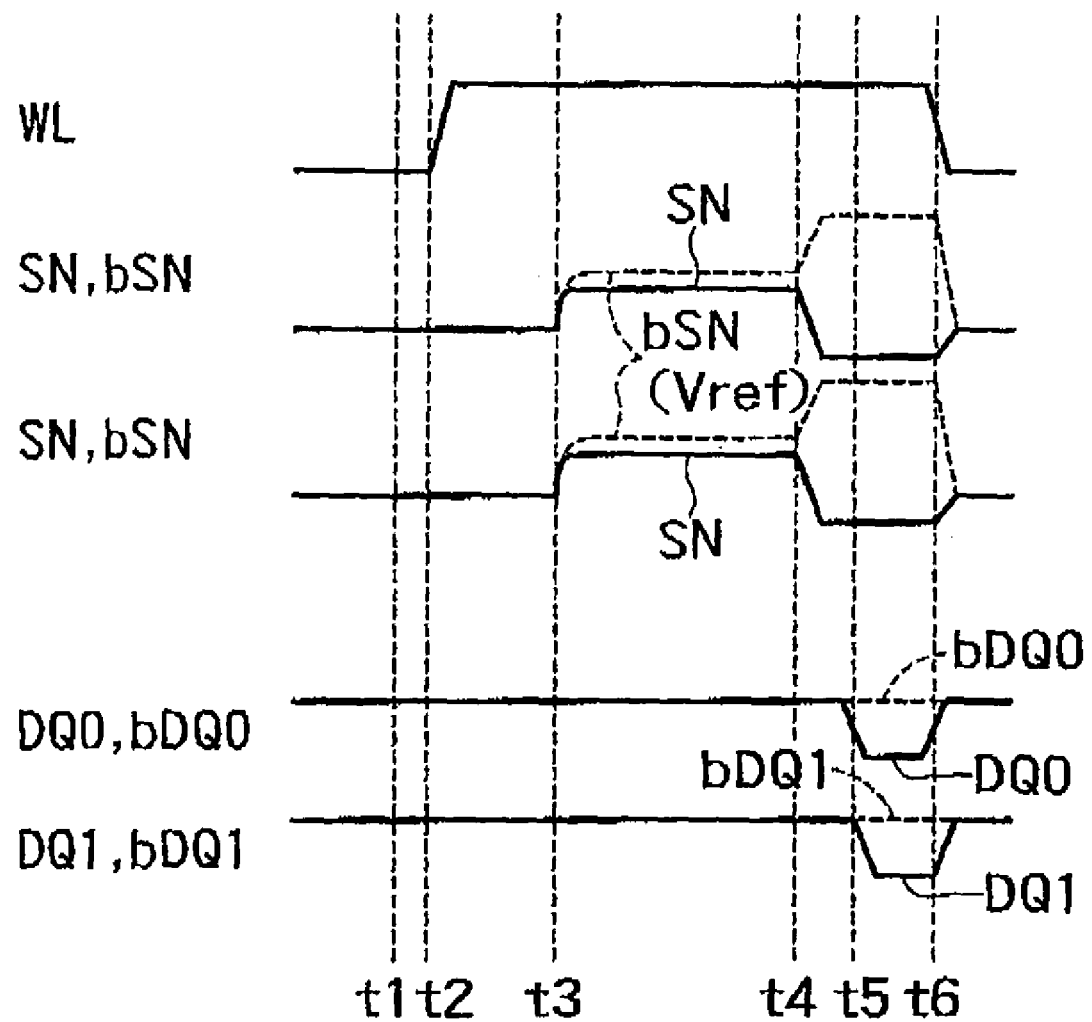

FIG. 8 and FIG. 9 are timing diagrams showing the operation of testing a threshold value of the FBC memory according to the second embodiment. FIG. 8 is a timing diagram when the word line voltage VWL is lower than the threshold voltage of the memory cell MC0, and FIG. 9 is a timing diagram when the word line voltage VWL is higher than the threshold voltage of the memory cell MC0. In the first test, because the test current is passed to the second current path CP2, the signal bLOADON_A is activated at the same timing as that of the signal bLOADON. In the first test, the signal bLOADON_B maintains the inactive state. In the second test, because the test current is passed to the second current path CP12, the signal bLOADON_B is activated at the same timing as that of the signal bLOADON. In the second test, the signal bLOADON_A maintains the inactive state. Other signal operations in the second embodiment are similar to those in the timing diagrams shown in FIG. 5 and FIG. 6, and therefore, explanations thereof will be omitted.

In the second embodiment, the first current path CP1 through which the reference current Iref is passed is common to the sense amplifier S/As of each column. Accordingly, the first current path CP1 can supply the constant stable reference voltage Vref to the sense amplifier S/A of each column. That is, the first current path CP1 can supply the reference voltage Vref having no variation to the sense amplifier S/A of each column. As a result, in the second embodiment, a threshold voltage of the memory cell MC can be measured in higher precision.

According to the second embodiment, the transistor P2 is made common to the sense amplifier S/A of each column. Therefore, the reference current Iref is constant, regardless of the number of columns, the number of the second current paths CP2, and the number of the sense amplifiers S/As.

When the mirror ratio (test current/reference current) is set smaller than one, the reference current Iref can be set larger than the test current. By setting the reference current Iref large, the rising speed of the potential of the sense node and the like can be made fast. This leads to the shortening of the test time.

In the second embodiment, a change of the size (W/L) of the transistor P2 gives smaller influence to the total size of the device than the change in the first embodiment.

The second embodiment can also achieve effects similar to those in the first embodiment.

Third Embodiment

Figure 10:
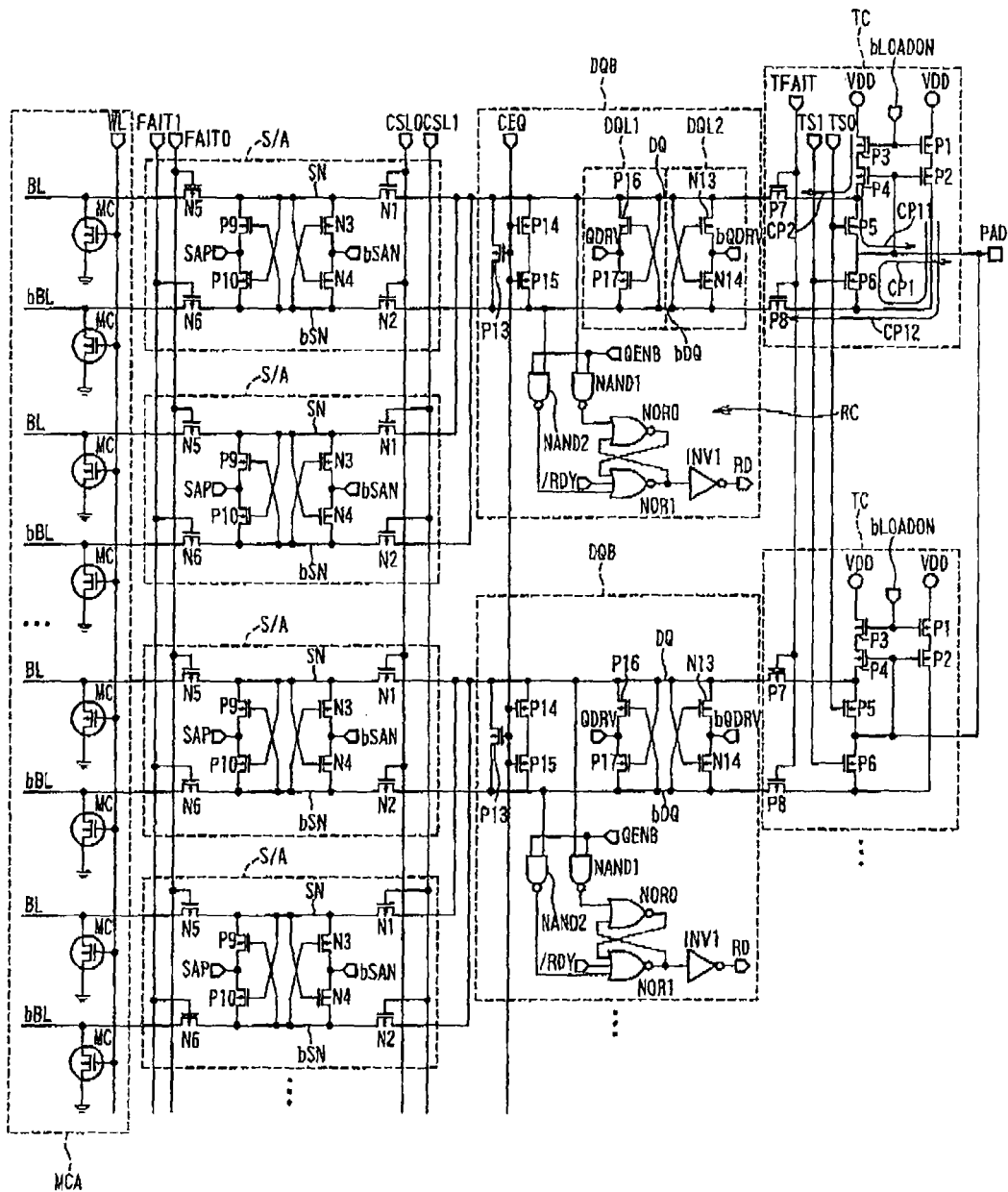
FIG. 10 is a circuit diagram of an FBC memory according to a third embodiment of the present invention.

FIG. 10 is a circuit diagram of an FBC memory according to a third embodiment of the present invention. A test circuit TC according to the third embodiment is different from the test circuit in the first embodiment in that the test circuit TC in the third embodiment is connected to a DQ buffer DQB. The DQ line and the bDQ line are connected between the current mirror circuit CM and the sense node pair SN, bSN, respectively. Other configurations in the third embodiment can be the same as those in the first embodiment. The mirror ratio of the transistors P2 and P4 in the third embodiment needs to be one for the same reason as that in the first embodiment.

The DQ buffer DQB is connected between the test pad PAD and the sense amplifier S/A, and includes latch circuits DQL1, DQL2, equalizing transistors P13 to P15, and a reading circuit RC. The latch circuits DQL1, DQL2 are cross-couple type dynamic latch circuits like the latch circuits LC1, LC2, respectively. However, the latch circuits DQL1, DQL2 are driven by signals QDRV, bQDRV, thereby latching data of the DQ line and the bDQ line. The transistors P13 to P15 are provided to equalize the DQ line and the bDQ line in the same potential during a standby period. Therefore, the transistors P13 to P15 become in the off state during the normal operation time or test time. The reading circuit RC is structured to output data latched into the DQ line and the bDQ line, to a reading unit RD at timing when a signal QENB is activated. NAND1 and NAND2 are NAND gates. NOR0 and NOR1 are NOR gates. INV1 is an inverter circuit.

Figure 11:
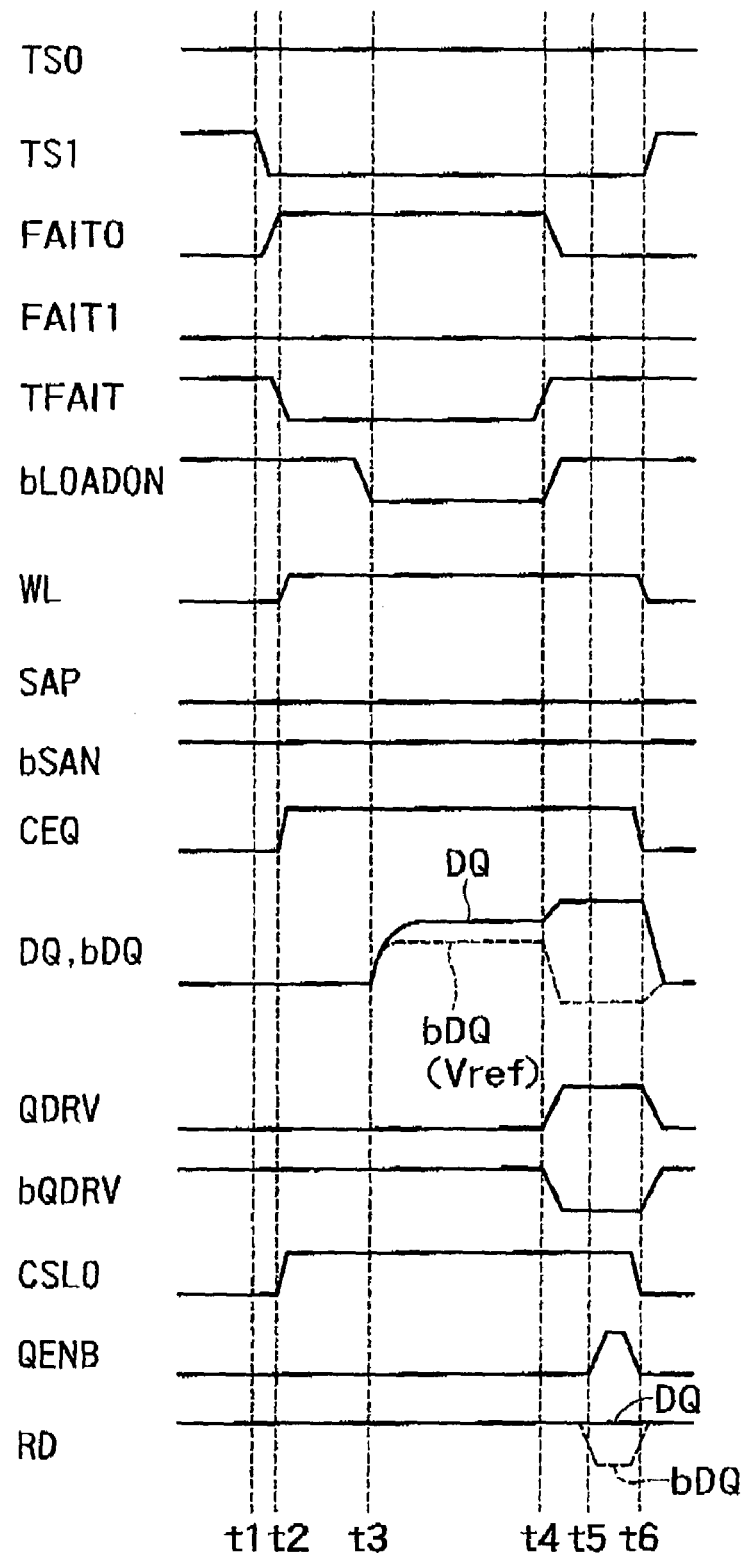
FIG. 11 and FIG. 12 are timing diagrams showing the operation of testing a threshold value of the FBC memory according to the third embodiment.
Figure 12:
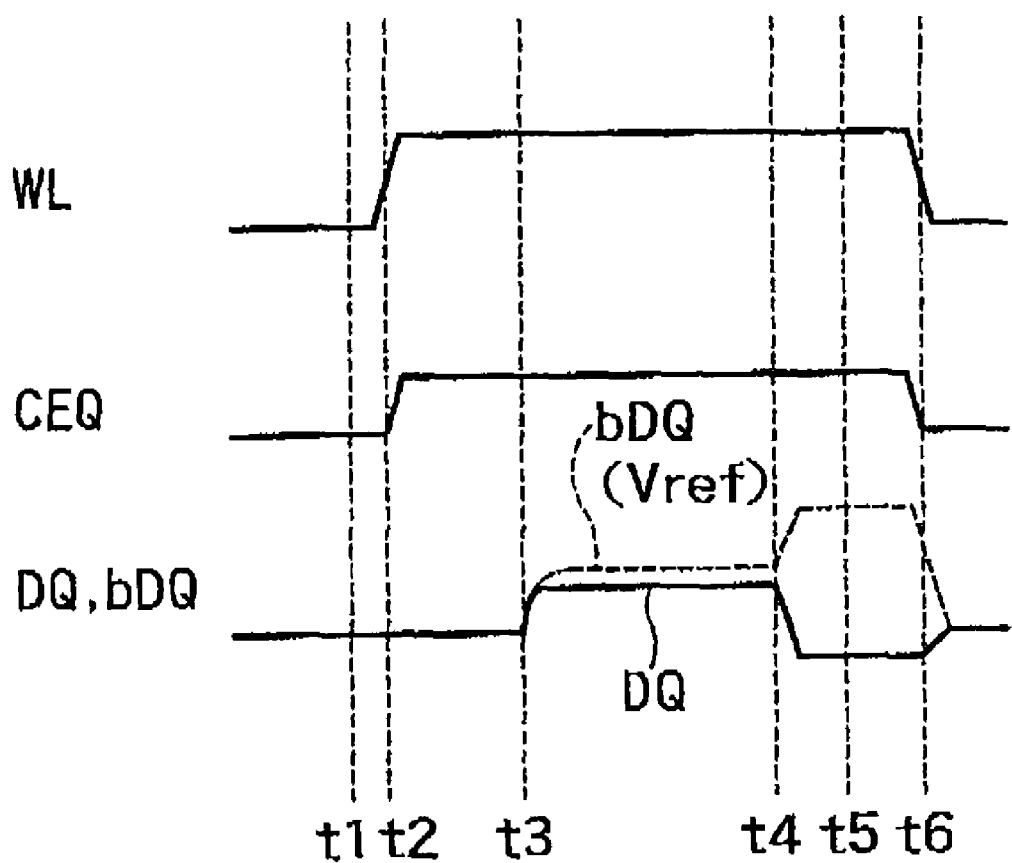

FIG. 11 and FIG. 12 are timing diagrams showing the operation of testing a threshold value of the FBC memory according to the third embodiment. FIG. 11 is a timing diagram when the word line voltage VWL is lower than the threshold voltage of the memory cell MC0, and FIG. 12 is a timing diagram when the word line voltage VWL is higher than the threshold voltage of the memory cell MC0.

In the third embodiment, at time t2, the signal CEQ becomes inactive, thereby turning off the transistors P13 to P15. Accordingly, the DQ line and the bDQ line are electrically separated, and thereby ending the equalizing.

In the third embodiment, the signals SAP, bSAN remain inactive, and the latch circuits LC1 and LC2 of the sense amplifier S/A are not driven. On the other hand, the signals QDRV and bQDRV are activated at time t4. Accordingly, the latch circuits DQL1 and DQL2 of the DQ buffer DQB are activated, thereby amplifying a potential difference between the potentials of the DQ line and the bDQ line. Accordingly, the DQ buffer DQB detects data within the memory cell MC at the test time in place of the sense amplifier S/A, and outputs the data to the outside.

Further, at time t5, the signal QENB is activated, and the data latched into the DQ line and the bDQ line are output from the reading unit RD.

Other operations in the third embodiment are similar to those in the first embodiment.

One DQ buffer DQB is provided for plural sense amplifiers S/As. For example, one DQ buffer DQB is provided for each 256 columns or 512 columns. Therefore, by providing a test circuit TC corresponding to the DQ buffer DQB, a circuit scale of the total device can be made small. Further, the third embodiment can also achieve effects similar to those in the first embodiment.

Fourth Embodiment

Figure 13:
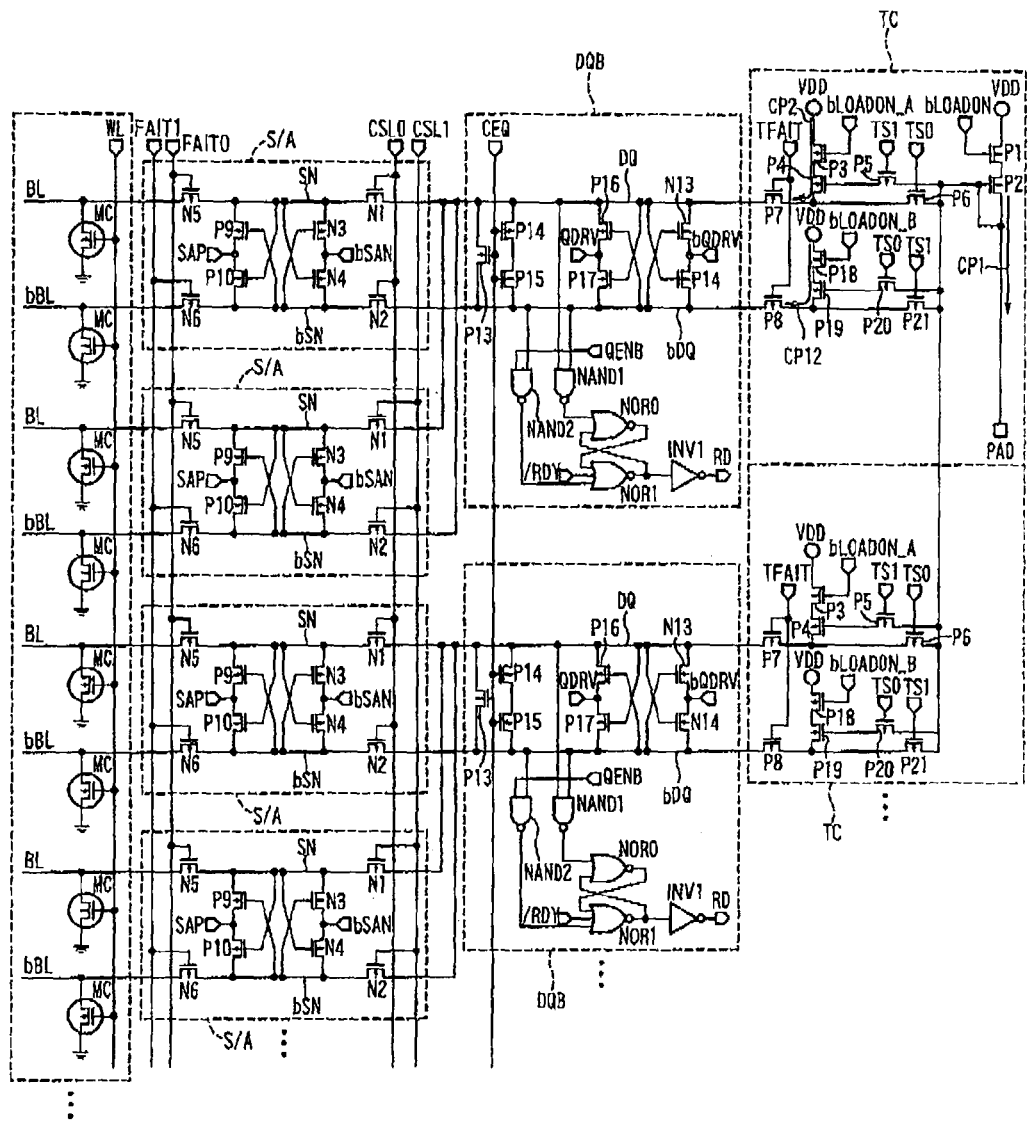
FIG. 13 is a circuit diagram of an FBC memory according to a fourth embodiment of the present invention.

FIG. 13 is a circuit diagram of an FBC memory according to a fourth embodiment of the present invention. The fourth embodiment is a combination of the second embodiment and the third embodiment. Therefore, in the fourth embodiment, the transistors P1 and P2 as well as the test pad PAD are made common to each column within the memory cell array MCA. In the fourth embodiment, the transistors P1 and P2 are always present in the first current path. That is, the first current path CP1 is made common to each column within the memory cell array MCA. Accordingly, the configuration of the test circuit TC is different from that of the third embodiment. The configuration of the test circuit TC in the fourth embodiment can be the same as that in the second embodiment. Configurations other than that of the test circuit TC in the fourth embodiment can be the same as those in the third embodiment.

Current driving capacities of the transistors P2 and P4 can be asymmetrical. That is, the current mirror circuit CM has a predetermined mirror ratio. Current driving capacities of the transistors P2 and P19 can be also asymmetrical. By making the mirror ratio small, the reference current Iref can be set large. By setting the reference current Iref large, the rising speed of the potential of the sense node and the like can be made fast. This leads to the shortening of the test time. The size (W/L) of the transistor P4 is equal to that of the transistor P19.

Figure 14:
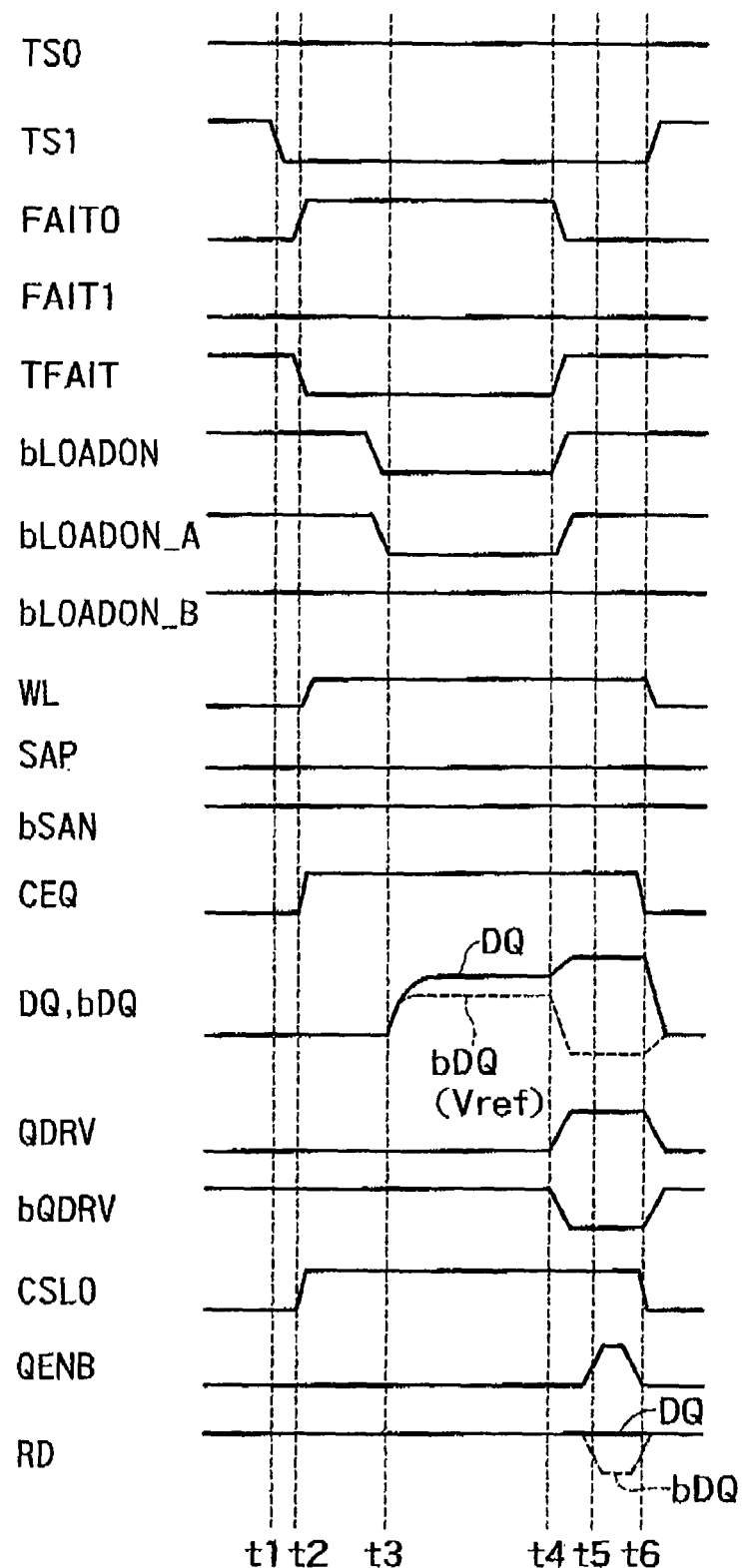
FIG. 14 and FIG. 15 are timing diagrams showing the operation of testing a threshold value of the FBC memory according to the fourth embodiment.
Figure 15:
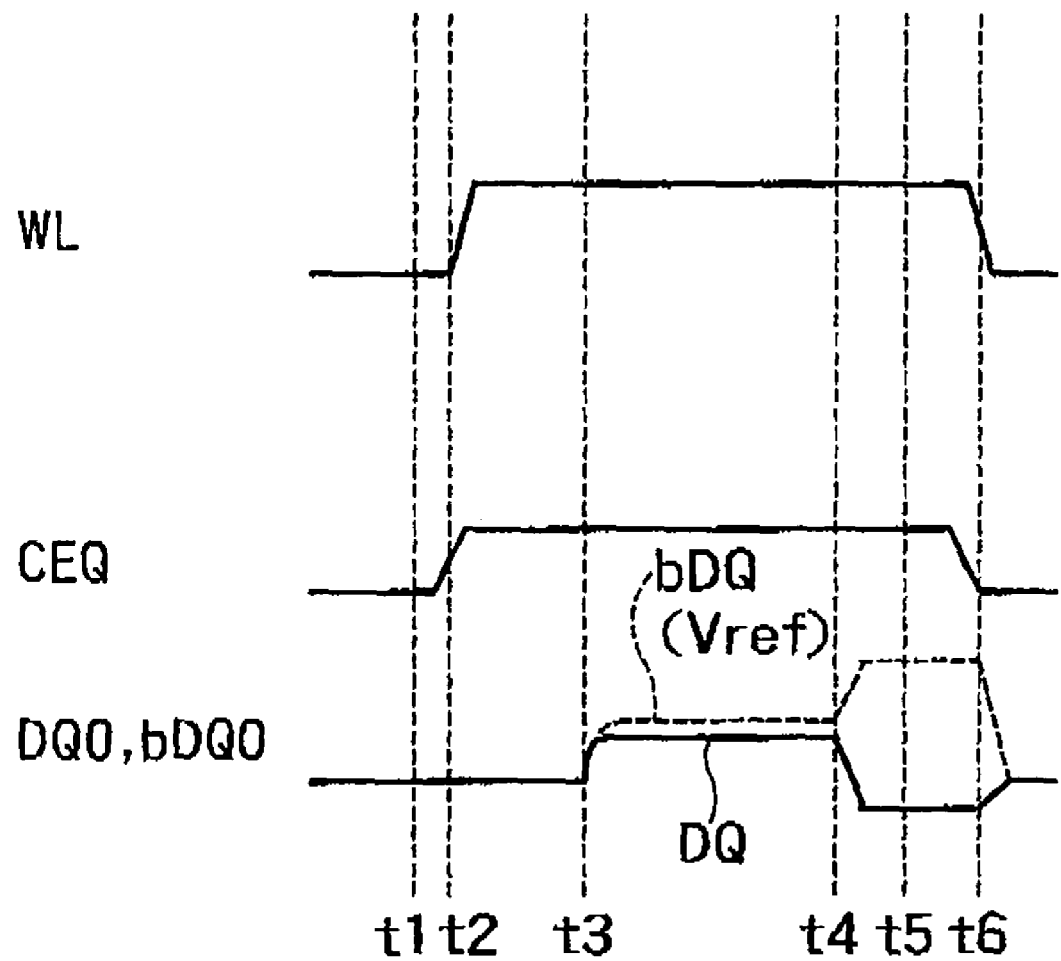

FIG. 14 and FIG. 15 are timing diagrams showing the operation of testing a threshold value of the FBC memory according to the fourth embodiment. FIG. 14 is a timing diagram when the word line voltage VWL is lower than the threshold voltage of the memory cell MC0, and FIG. 15 is a timing diagram when the word line voltage VWL is higher than the threshold voltage of the memory cell MC0.

A first test and a second test in the fourth embodiment are substantially the same as those explained in the second embodiment. However, in the fourth embodiment, a test current flows to the memory cell concerned via the DQ line or the bDQ line. In other word, the second current path CP2 passes the test current to the memory cell MC via the DQ line, the sense node SN, and the bit line BL. The second current path CP12 passes the test current to the memory cell MC via the bDQ line, the sense node bSN, and the bit line bBL.

In the first test, because the test current is passed to the second current path CP2, the signal bLOADON_A is activated at the same timing as that of the signal bLOADON. In the first test, the signal bLOADON_B maintains the inactive state. In the second test, because the test current is passed to the second current path CP12, the signal bLOADON_B is activated at the same timing as that of the signal bLOADON. In the second test, the signal bLOADON_A maintains the inactive state. Other signal operations in the fourth embodiment are similar to those in the timing diagrams shown in FIG. 11 and FIG. 12, and therefore, explanations thereof will be omitted.

The fourth embodiment can achieve effects of both of the second and third embodiments.

In the first to the fourth embodiments, the transfer gates P7 and P8 can be n-type FETs.

In the above embodiments, the memory cell MC includes the n-type FETs. However, the memory cell MC can include p-type FETs. In this case, voltages applied to the selection word line and the bit line need to be inverted. Read data are logically inverted from the read data in the above embodiments.

The invention claimed is:

1. A semiconductor memory device comprising:
a memory cell array having memory cells arrayed two-dimensionally;
word lines connected to the memory cells of rows of the memory cell array;
bit lines connected to the memory cells of columns of the memory cell array;
sense amplifiers connected to the bit lines, and which detect data stored in the memory cells;
a test pad that passes a predetermined reference current from a power source, and transmits a reference voltage based on the reference current; and
at least one test circuit connected between the power source and the test pad and connected between the power source and the bit lines, the at least one test circuit passing test currents via the bit lines, the test currents depending on the reference voltage.

2. The semiconductor memory device according to claim 1, wherein
the at least one test circuit comprises:
a first current path that passes the reference current between the power source and the test pad;
a second current path that passes the test current between the power source and the memory cell;
a first transistor connected in the first current path, and having a gate and a source or a drain connected to the test pad at a test time; and
a second transistor connected in the second current path, and having a gate connected to the test pad in common with the gate of the first transistor.

3. The semiconductor memory device according to claim 1, wherein
each of the sense amplifiers includes a first and a second sense nodes corresponding to a pair of the bit lines, respectively;
the at least one test circuit includes:
a first transistor connected between the first sense node and the power source, and having a gate connected to the test pad,
a second transistor connected between the second sense node and the power source, and having a gate connected to the test pad,
a first node being between the first transistor and the first sense node,
a second node being between the second transistor and the second sense node, and
a third and a fourth transistors being connected in series between the first node and the second node, a third node being between the third transistor and the fourth transistor being connected to the test pad,
the memory cell being connected to the first sense node, the third transistor configured to be set to the on state and the fourth transistor configured to be set to the off state to pass the reference current to a path connecting between the power source and the test pad via the first and the third transistors and to pass the test current to a path connecting between the power source and the memory cell via the second transistor, when a first test signal is received, and
the memory cell being connected to the second sense node, the third transistor configured to be set to the off state and the fourth transistor configured to be set to the on state to pass the reference current to the path connecting between the power source and the test pad via the second and the fourth transistors and to pass the test current to the path connecting between the power source and the memory cell via the first transistor when a second test signal is received.

4. The semiconductor memory device according to claim 1, wherein there are a plurality of test circuits including the at least one test circuit and the test pad is common to the plurality of the test circuits.

5. The semiconductor memory device according to claim 3, wherein there are a plurality of test circuits including the at least one test circuit and the test pad is common to the plurality of the test circuits.

6. The semiconductor memory device according to claim 2, wherein the first and the second transistors form a current mirror circuit having a mirror ratio one.

7. The semiconductor memory device according to claim 2, wherein there are a plurality of test circuits including the at least one test circuit and the first transistor or the second transistor is common to the plurality of the test circuits.

8. The semiconductor memory device according to claim 1, wherein each of the sense amplifiers includes two sense nodes corresponding to the pair of bit lines, respectively, there are a plurality of test circuits including the at least one test circuit, and
the at least one test circuit includes:

a first transistor connected between the test pad and the power source, and having a gate and a drain or a source connected to the test pad, two second transistors connected between the two sense nodes and the power source respectively, and provided corresponding to the two sense nodes, two third transistors connected between the test pad and nodes between the second transistor and the sense nodes respectively, and provided corresponding to the two sense nodes, and two fourth transistors connected between gates of the second transistors and the test pad, and provided corresponding to the two sense nodes, and the first transistor and the test pad are provided in common to the plurality of the test circuits.

9. The semiconductor memory device according to claim 8, wherein the memory cell being connected to a first sense node of the plurality of sense nodes, the third transistor corresponding to the first sense node configured to be set to the off state, the fourth transistor corresponding to the first sense node configured to be set to the on state, the third transistor corresponding to a sense node other than the first sense node configured to be set to the on state, and the fourth transistor corresponding to a sense node other than the first sense node configured to be set to the off state, and the reference current flows in a path connecting between the power source and the test pad via the first transistor, and the test current flows in another path connecting between the power source and the memory cell via the second transistor corresponding to the first sense node, when a first test signal is received.

10. The semiconductor memory device according to claim 8, wherein the first and the second transistors constitute a current mirror circuit, and a ratio of the test current flowing through the second transistor to the reference current flowing through the first transistor is smaller than one.

11. The semiconductor memory device according to claim 9, wherein the first and the second transistors constitute a current mirror circuit, and a ratio of the test current flowing through the second transistor to the reference current flowing through the first transistor is smaller than one.

12. The semiconductor memory device according to claim 1, further comprising a DQ buffer for reading data of the sense amplifier to an outside of the memory device, or writing data from the outside of the memory device to the sense amplifier, wherein the at least one test circuit is connected to the DQ buffer.

13. The semiconductor memory device according to claim 12, wherein there are a plurality of test circuits including the at least one test circuit and the test pad is common to the plurality of the test circuits.

14. The semiconductor memory device according to claim 12, wherein first and second transistors form a current mirror circuit having a mirror ratio one.

15. The semiconductor memory device according to claim 12, wherein the DQ buffer includes two sense nodes corresponding to a pair of bit lines, respectively, there are a plurality of test circuits including the at least one test circuit, and the at least one test circuit includes:

a first transistor connected between the test pad and the power source, and having a gate and a drain or a source connected to the test pad, two second transistors connected between the two sense nodes and the power source respectively, and provided corresponding to the two sense nodes, two third transistors connected between the test pad and nodes between the second transistor and the sense nodes respectively, and provided corresponding to the two sense nodes, and two fourth transistors connected between gates of the second transistors and the test pad, and provided corresponding to the two sense nodes, and the first transistor and the test pad are provided in common to the plurality of the test circuits.

16. The semiconductor memory device according to claim 15, wherein the memory cell being connected to a first sense node of the plurality of sense nodes, the third transistor corresponding to the first sense node configured to be set to the off state, the fourth transistor corresponding to the first sense node configured to be set to the on state, the third transistor corresponding to a sense node other than the first sense node configured to be set to the on state, and the fourth transistor corresponding to a sense node other than the first sense node configured to be set to the off state, and the reference current flows in a path connecting between the power source and the test pad via the first transistor, and the test current flows in another path connecting between the power source and the memory cell via the second transistor corresponding to the first sense node, when a first test signal is received.

* * * * *